United States Patent
Doi et al.

(10) Patent No.: US 7,571,639 B2
(45) Date of Patent: Aug. 11, 2009

(54) METHOD OF CORRECTING OPAQUE DEFECT OF PHOTOMASK USING ATOMIC FORCE MICROSCOPE FINE PROCESSING DEVICE

(75) Inventors: Toshio Doi, Chiba (JP); Kazutoshi Watanabe, Chiba (JP); Osamu Takaoka, Chiba (JP); Atsushi Uemoto, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 232 days.

(21) Appl. No.: 11/796,996

(22) Filed: Apr. 27, 2007

(65) Prior Publication Data

US 2007/0281222 A1    Dec. 6, 2007

(30) Foreign Application Priority Data

Apr. 28, 2006  (JP) .............................. 2006-124678

(51) Int. Cl.
*H01J 37/352* (2006.01)
(52) U.S. Cl. ........................................................ 73/105
(58) Field of Classification Search .................... 73/105
See application file for complete search history.

(56) References Cited

U.S. PATENT DOCUMENTS

| 7,107,826 B2 * | 9/2006 | Watanabe et al. ............. 73/105 |
| 2006/0254347 A1 * | 11/2006 | Watanabe et al. ............. 73/105 |
| 2006/0254348 A1 * | 11/2006 | Watanabe et al. ............. 73/105 |

OTHER PUBLICATIONS

Y. Morikawa et al. "Defect repair performance using the nanomachining repair technique", Proc. Of SPIE 5130 P520-527 (2003).

* cited by examiner

*Primary Examiner*—Kiet T Nguyen
(74) *Attorney, Agent, or Firm*—Brinks Hofer Gilson & Lione

(57) ABSTRACT

An opaque defect is processed by scanning with a high load or height fixed mode using a probe harder than a pattern material of a photomask at the time of going scanning, and is observed by scanning with a low load or intermittent contact mode at the time of returning scanning so as to detect an ending point of the opaque defect by the height information. When there is a portion reaching to a glass substrate as an ending point, this portion is not scanned by the high load or height fixed mode in the next processing, and only a portion not reaching to the ending point is scanned by the high load or height fixed mode.

5 Claims, 4 Drawing Sheets

GOING SCANNING (OBSERVING)

RETURNING SCANNING (MOVING)

METHOD OF CORRECTING OPAQUE DEFECT OF PHOTOMASK USING ATOMIC FORCE MICROSCOPE FINE PROCESSING DEVICE

This application claims priority under 35 U.S.C. §119 to Japanese Patent Application No. JP2006-124678 filed Apr. 28, 2006, the entire content of which is hereby incorporated by reference.

BACKGROUND OF THE INVENTION

The present invention relates to an ending point detecting method and a drift correcting method for correcting an opaque defect of a photomask using an atomic force microscope technique.

A fine processing technique in a nanometer order has been required in order to advance and make high integration of functions, and a processing technique such as a partial anodizing and oxidizing and a fine scratch processing using a scanning probe microscope (SPM) has been famously researched and developed. Recently, a practical processing device has been required to form an accurate shape and have high accurate processing, in addition to pursuit the fine processing property.

An example of a recent device based on an atomic force microscope (AFM), which is required to form an accurate shape and have high accurate processing, is a device for correcting a pattern opaque defect of a photomask (see, for example, Y. Morikawa, H. Kokubo, M. Nishiguchi, N. Hayashi, R. White, R. Bozak, and L. Terrill, Proc. Of SPIE 5130 520-527 (2003). When the opaque defect of a photomask is corrected using an atomic force microscope, a probe of an atomic force microscope harder than a material to be processed (a material having an opaque defect) is used. When observing, the material is imaged having an ordinary low load contact mode or intermittent contact mode of the atomic force microscope so as to recognize a defect portion. Further, when processing, the hard probe is fixed to the same height as the surface of a glass substrate having a high load contact mode or by cutting feedback, and an opaque defect portion on the glass surface is scanned so as to be physically eliminated and processed.

In a case of a focused ion beam defect conventionally used as a device for correcting a fine defect of a photomask, an isolated defect is hardly observed and processed due to charging-up. In such the case, the atomic force microscope can be used for correcting an opaque defect of a photomask and has been recently used in a photomask production field. As a mask is an original edition at the time of wafer transfer, if processing accuracy of a corrected portion is not enough or there is an over etch or grinding remainder, transfer property of the photomask is bad-influenced so as to cause a device defect to all of the transferred wafers. Therefore, a processing to form an accurate shape and have high accuracy is needed by the mechanical eliminating and processing technique using an atomic force microscope.

In a conventional method for correcting an opaque defect of a photomask using an atomic force microscope, a processing is performed by: observing an area including an opaque defect so as to determine an area to be processed (an opaque defect area); and eliminating the area so as not to grind a glass by grinding too much. This processing is performed by: separately and alternately observing to acquire height information; making a processing ending point when reaching an area on a glass surface; and eliminating and processing only a grinding remainder portion next time except the processing ending point. This processing is repeated so as to reduce an over etch or grinding remainder as much as possible. That is, in the conventional method for correcting a pattern opaque defect of a photomask using an atomic force microscope, scanning for processing and scanning for observing are respectively performed in general. In both scanning, only going scanning is performed in order not to deviate an image and a processing position as illustrated in FIG. 2A, and returning scanning is performed while pulling up a probe to the height in order not to contact to the pattern so as to move to a start point of a next scanning as illustrated in FIG. 2B. Therefore, when an opaque defect is corrected by repeating processing and observation many times, much times are necessary for total correcting, so that throughput is decreased.

Further, when a drift is cased during a processing, a processing position is deviated from a desired position. So, a normal pattern is ground or a glass substrate is over-etched so that the optical property is reduced after correcting. Therefore, reducing a drift is an important technique in order to perform a high accuracy processing. However, in the conventional technique, a drift is corrected by: moving a probe to an observation start point of a drift marker during a processing so as to observe; comparing XY information of the marker before processing with that after observing; calculating a drift amount; and adding an offset of the drift amount to an area to be processed next time. In this case, the probe is moved to a portion which will be a drift marker of a processing area after processing, so that it takes time.

The present invention solves the above-described problems, and an objective of the present invention is to realize a high accuracy processing not having an over etch and grinding remainder while increasing throughput when a defect of a mask is corrected using an atomic force microscope technique.

SUMMARY OF THE INVENTION

For solving the problems, in a method for eliminating an opaque defect of a photomask using an atomic force microscope fine processing device according to the present invention, the following means are used. In the present invention, the opaque defect means an opaque defect of a film material or a quartz bump defect on an Alternating Aperture Phase Sifting Mask (AAPSM).

The first means includes: processing an opaque defect of a photomask by scanning with a predetermined load or predetermined height fixed mode using a probe harder than a pattern material of the photomask at the time of going scanning; observing a part processed at the time of the going scanning by scanning with a low load than the predetermined load or intermittent contact mode at the time of returning scanning; and detecting an ending point of a processing area by the height information of the observed part.

The second means includes reconfiguring the information for every line, acquired by the scanning with the low load or intermittent contact mode at the time of the returning scanning, to an image for the processing area; calculating a drift amount of the processing area by comparing typical patterns or position information of defect shapes between a previous reconfigured image and a new reconfigured image; and performing a next processing in the area in which the drift is corrected.

Third means includes correcting an offset amount of the probe position with respect to XY information of the returning scanning, the offset being occurred between the going scanning and the returning scanning.

Fourth means is that the offset is measured by a deviation between a set position of a processed mark and an observed position of the processed mark.

That is, returning scanning, which is used for only moving in the conventional scanning, is used for detecting an ending point and observing to acquire drift information. An opaque defect is processed by scanning with a high load or height fixed mode using a probe harder than a pattern material of a photomask at the time of going scanning; height information for every line is acquired by scanning with a low load or intermittent contact mode at the time of the returning scanning; and an ending point of a processing area is detected by this height information. In the next processing to the same area, a portion reaching to the ending point is not scanned by the scanning with the high load or height fixed mode, and only a portion not reaching to the ending point is scanned by the scanning with the high load or height fixed mode. Since an offset occurs between the going scanning and returning scanning due to the scanning directions according to processing conditions and observation conditions, height information of the returning scanning is corrected based on the offset amount so as to more accurately detect an ending point.

Further, information for every line acquired by the returning scanning with the low load or intermittent contact mode is reconfigured to make an image of the whole processing area, and information in the XY directions of the reconfigured image is used for correcting a drift. A typical pattern to be a drift marker and position information of a defect shape are compared between the previous reconfigured image and the new reconfigured image so as to calculate a drift amount in the processing area, and the area in which a drift is corrected is processed next time. Since an offset occurs between the going scanning and returning scanning due to the scanning directions according to processing conditions and observation conditions, XY information of the returning scanning is corrected based on the offset amount so as to more accurately detect a drift amount, and thus the returning scanning is more accurately corrected.

According to the present invention, when a defect of a mask are corrected using an atomic force microscope technique, a processing not having an over etch and grinding remainder and a high accuracy processing can be realized while increasing throughput.

That is, since the present invention effectively uses returning scanning conventionally used for only moving to the start point of a next line, total time for processing and observing can be shortened. Further, since the present invention detects a processing ending point by the height information of an image acquired by returning processing scanning, an ending point can be monitored for every processing scanning, and thus a processing having few over etches and grinding remainders can be performed.

Further, the present invention measures a drift amount by the XY information of an image, which is acquired by returning scanning with a low load or intermittent contact mode, and by comparing a pattern and position information of a defect with those of the previous processing, so as to correct a drift of the next processing. Thus, reducing processing accuracy by a drift can be prevented, and a high accuracy processing can be performed for a short time.

DETAILED DESCRIPTION OF THE PREFERRED EMBODIMENTS

Hereinafter, examples of the present invention will be described in detail with reference to drawings.

Figure 2A:
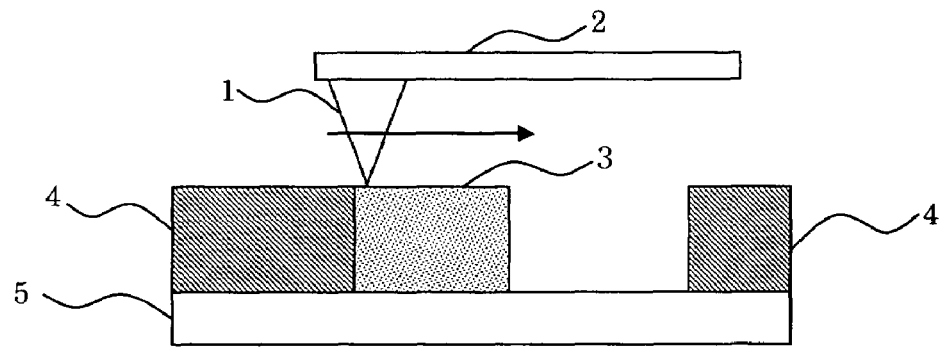
FIGS. 2A to 2C are views for explaining a conventional scanning method.
Figure 2B:
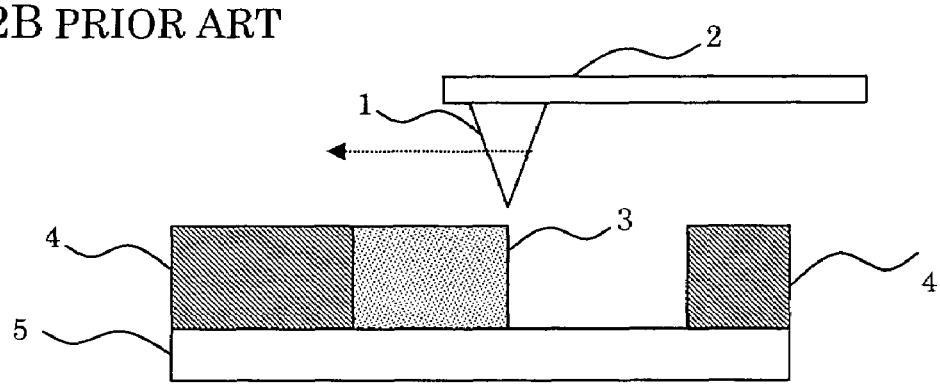
Figure 2C:
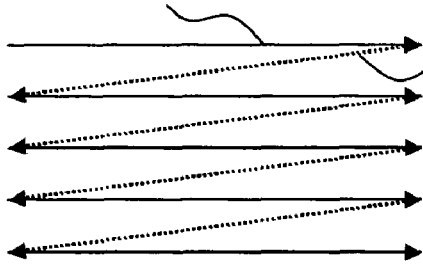

A photomask having an opaque defect found by a defect inspection device is introduced into an atomic force microscope defect correcting device, and a high accuracy XY stage is moved so as to position the opaque defect portion at the center of a view. When an opaque defect 3 is extracted in the atomic force microscope defect correcting device, the conventional method is used. That is, in FIGS. 2A-2C, in the conventional scanning method (FIG. 2C) where the going scanning is for observing (FIG. 2A) and the returning scanning is performed while pulling up a probe to the height not to contact to a pattern and moving it to the next start point (FIG. 2B), an area including the opaque defect 3 is imaged having a contact mode or intermittent contact mode of the atomic force microscope so as to be compared with a normal pattern 4 by pattern matching or the like, and thus the opaque defect portion 3 is extracted and recognized.

Figure 1A:
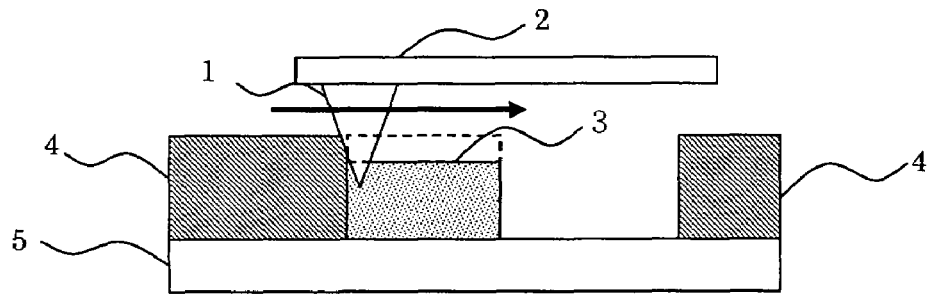
FIGS. 1A to 1C are views for explaining the case according to the present invention in which going scanning is for processing and returning scanning is for observing so as to detect an ending point.
Figure 1B:
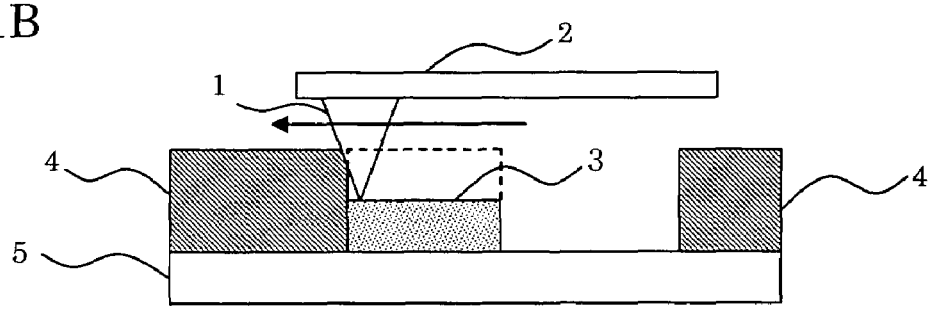
Figure 1C:
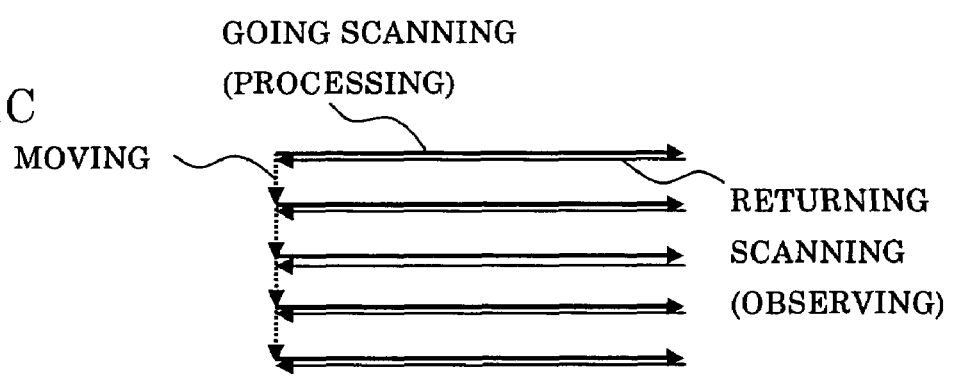

FIGS. 1A-1C are views for explaining the case according to the present invention in which going scanning is for processing and returning scanning is for observing and detecting an ending point.

After the opaque defect portion 3 is extracted and recognized by the above-described method, the going scanning is performed toward the base of a cantilever 2 in FIGS. 1A-1C. At this time, the recognized opaque defect 3 is eliminated and processed by a probe 1, for example, made of a diamond harder than a pattern material or a photomask as a material to be processed, and by the scanning (FIG. 1A) having a high load or height fixed mode so as to eliminate the opaque defect 3. Further, in the returning scanning, the defect portion is observed by the scanning (FIG. 1B) having a lower load than that of the going scanning or an intermittent contact mode. The eliminating processing and observation are repeated (FIG. 1C), and an ending point of a processing area (an opaque defect) is detected by the height information of the eliminated and processed portion acquired by the observation. In the going processing scanning, when there is an area not needed to be processed, the scanning is performed setting only the area to have a low load or to the height not to contact to a pattern. The cantilever 2 is used in order not to twist and not to be deviated at a processing position when processing having a high load.

Then, the probe returned to the start point after observing the first line is pulled up to the height not to contact to the pattern so as to move to the start line of a next line, and the going scanning with the high load or in the height fixed mode and the returning scanning with the low load or intermittent contact mode are performed again. Moving the probe to the start line of a next line, the going processing scanning and the returning observing scanning are repeated until the whole area to be processed is processed and observed, that is, the processing scanning and the observing scanning are repeated until the whole opaque defect area is processed and observed. In the next processing to the same portion, the processed portion having reached to ending point is not scanned by the high load or height fixed mode, and only the portion not reached to the ending point (a glass substrate 5) is processed by the scanning with the high load or height fixed mode. Until the whole opaque defect is reached to the ending point (the glass substrate 5) so as to finish correcting the defect, the going scanning with the high load or height fixed mode and the returning scanning with the low load or intermittent contact mode are repeated to the whole area to be processed.

Figure 3:
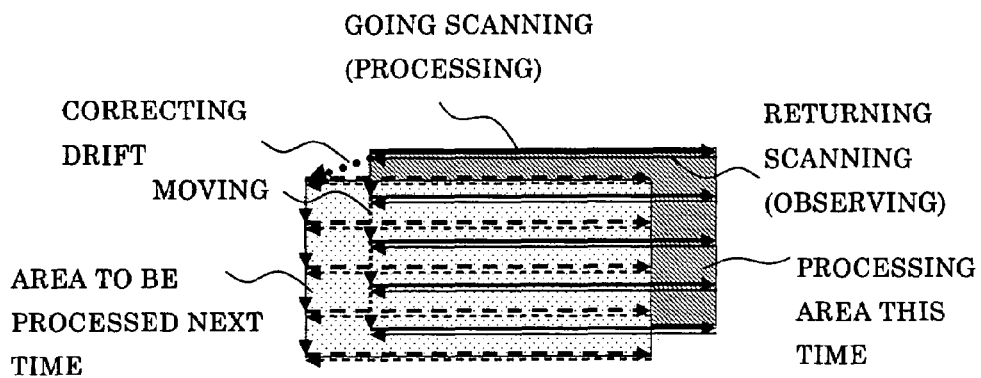
FIGS. 3 is a view for explaining the case for correcting a drift by processing in going scanning and observing in a retuning scanning.

Information for every line acquired by the returning scanning with the low load or intermittent contact mode is reconfigured so as to make an image of the whole processing area, and a typical pattern to be a drift marker or position information of a defect shape is compared between the previous reconfigured image and the new reconfigured image so as to calculate a drift amount of the processing area. Then, the area in which a drift is corrected is processed next time as illustrated in FIG. 3. The drift is also repeatedly corrected until the whole opaque defect is reached to the ending point (the glass substrate 5) and correcting the defect is finished.

Figure 4A:
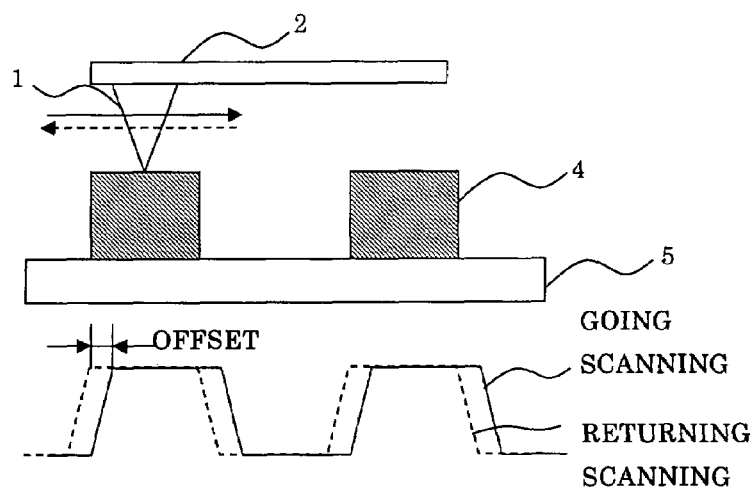
FIGS. 4A and 4B are views for explaining the case for detecting an ending point while considering an offset between going scanning (for processing) and returning scanning (for observing).
Figure 4B:
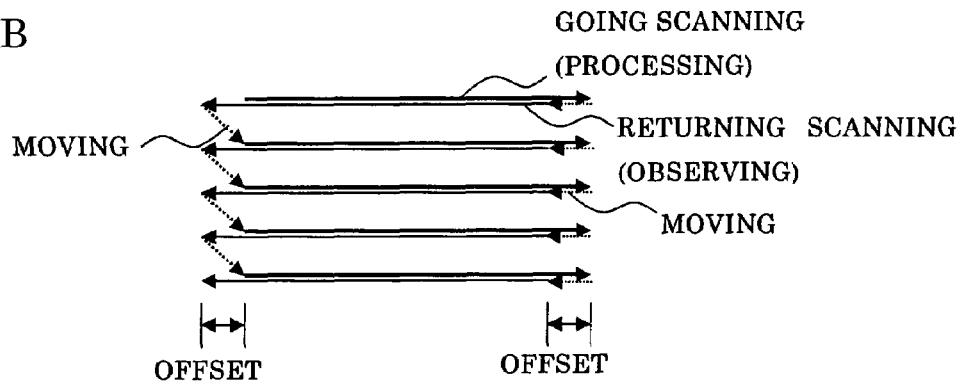

As illustrated in FIG. 4A, a fixed offset occurs between the going processing scanning with the high load or height fixed mode and the returning observing scanning with the low load or intermittent contact mode due to the scanning directions according to the processing conditions or observation conditions. The offset is based on the difference of twists due to the difference of the loads at the time of going and returning scanning. In this case, as illustrated in FIG. 4B, the going and returning scanning start after pulling up the probe to the height not to contact to the pattern and moving it based on the fixed offset amount. Thereby, the information acquired by the returning scanning corresponds to the going scanning so as to more accurately detect the ending point. The fixed offset between the going and returning scanning is measured in advance by a deviation of the set position of a processed mark and the observed position of the processed mark.

Figure 5:
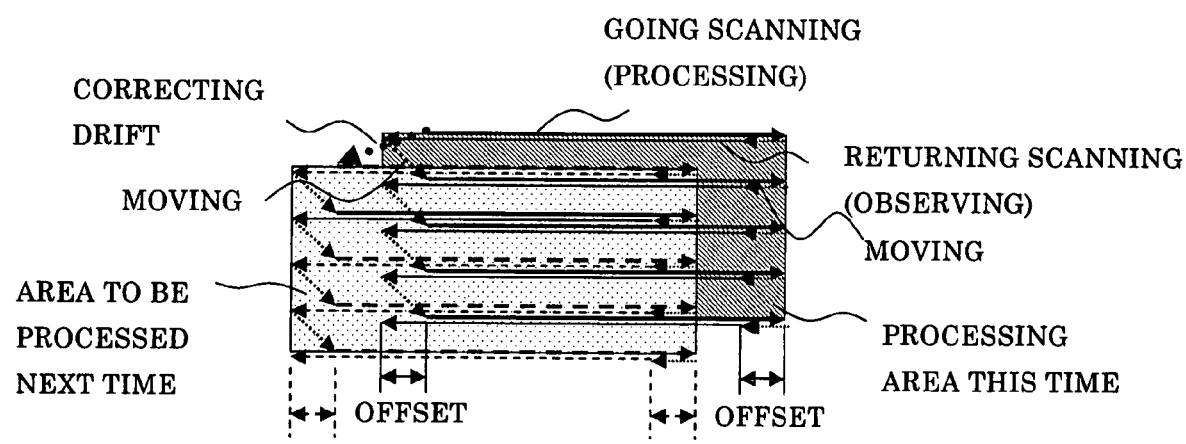
FIG. 5 is a view for explaining the case for correcting a drift while considering an offset between going scanning (processing) and returning scanning (observing).

As illustrated in FIG. 5, the offset occurs between rectangular processing areas of this time and next time according to the processing conditions and observing conditions like the above-described case. So, in the going and returning scanning, the prove is pulled up to the height not to contact to the pattern and moved based on the fixed offset amount between the going processing scanning with the high load or height fixed mode and the returning observing scanning with the low load or intermittent contact mode. Thereby, the information acquired by the returning scanning corresponds to the going scanning. That is, the deviation amount of the offset is considered so as to correctly feed back the position information acquired by the observation with respect to the processing position. Further, typical pattern to be a drift marker or position information of a defect shape are compared between the previous and new reconfigured images so as to calculate a drift amount of the processing area. Thereby, the drift is more accurately corrected.

Accordingly, since the returning scanning which is conventionally used for only moving to the start point of a next line is effectively used, the total defect correcting time for observing to detect an ending point and correct a drift can be shorter than that of the conventional processing method. Since a processing ending point is detected by height information of an image acquired by the returning processing scanning, every processing scanning can be monitored, and thus a processing having few over etches and grinding remainders can be performed.

Further, a reference pattern or a position of a defect are compared between XY information of an image acquired by the returning processing scanning with the low load and intermittent contact mode and the previous XY information so as calculate a drift amount, and thus a drift is corrected to the next processing area. So, reducing processing accuracy by the drift (grinding a normal pattern or grinding remainder of the opaque defect of a base part) and damaging to a glass substrate can be prevented, and a high accuracy processing with high transmissivity can be performed.

The present invention can be applied any type of opaque defects at any type of film materials and quartz bump defects on Alternating Aperture Phase Sifting Masks(AAPSM).

What is claimed is:

1. A method for eliminating an opaque defect of a photomask using an atomic force microscope fine processing device, the method comprising the steps of:
    processing an opaque defect of a photomask by scanning with a predetermined load or predetermined height fixed mode using a probe harder than a pattern material of the photomask at the time of going scanning;
    observing a part processed by the going scanning with a low load than the predetermined load or intermittent contact mode at the time of returning scanning; and
    detecting an ending point of a processing area by the height information of the observed part.

2. A method for eliminating an opaque defect of a photomask using an atomic force microscope fine processing device according to claim 1, further comprising the steps of:
    reconfiguring information for every line, acquired by the scanning with the low load or intermittent contact mode at the time of returning scanning, to an image for the processing area;
    calculating a drift amount of the processing area by comparing typical patterns and position information of defect shapes between a previous reconfigured image and a new reconfigured image; and
    performing a next processing in the area in which the drift is corrected.

3. The method for eliminating an opaque defect of a photomask using an atomic force microscope fine processing device according to claim 2, further comprising the step of:
    correcting an offset amount of the probe position with respect to XY information of the returning scanning, the offset being occurred between the going scanning and the returning scanning.

4. A method for eliminating an opaque defect of a photomask using an atomic force microscope fine processing device according to claim 1, further comprising the step of:
    correcting an offset amount of the probe position with respect to XY information of the returning scanning, the offset being occurred between the going scanning and the returning scanning.

5. The method for eliminating an opaque defect of a photomask using an atomic force microscope fine processing device according to claim 4, wherein the offset is measured by deviation between a set position of a processed mark and an observed position of the processed mark.

* * * * *